United States Patent
Kumar et al.

(10) Patent No.: US 8,584,077 B1
(45) Date of Patent: Nov. 12, 2013

(54) USER-CONTROLLABLE CONNECTIVITY ENGINE FOR ELECTRONIC DESIGN AUTOMATION TOOLS

(75) Inventors: Arbind Kumar, New Delhi (IN); John Robert Lefebvre, II, Atlanta, GA (US); Krishna Kumar Banka, Haryana (IN); Peter Niday, Genoa, NV (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/562,173

(22) Filed: Jul. 30, 2012

(51) Int. Cl.
  *G06F 17/50* (2006.01)
(52) U.S. Cl.
  CPC ........ *G06F 17/5077* (2013.01); *G06F 17/5022* (2013.01); *G06F 17/505* (2013.01); *G06F 17/5072* (2013.01); *G06F 17/5081* (2013.01)
  USPC ........... 716/139; 716/102; 716/118; 716/126; 716/138; 703/14
(58) Field of Classification Search
  CPC .............. G06F 17/5022; G06F 17/505; G06F 17/5072; G06F 17/5077; G06F 17/5081
  USPC ............. 716/139, 102, 118, 126, 138; 703/14
  See application file for complete search history.

(56) References Cited

U.S. PATENT DOCUMENTS

| | | | | |
|---|---|---|---|---|
| 5,414,809 A * | 5/1995 | Hogan et al. | | 715/765 |
| 6,240,541 B1 * | 5/2001 | Yasuda et al. | | 716/112 |
| 6,513,147 B1 * | 1/2003 | Nakatsu et al. | | 716/120 |
| 6,857,110 B1 * | 2/2005 | Rupp et al. | | 716/136 |
| 7,016,794 B2 * | 3/2006 | Schultz | | 702/64 |
| 7,353,482 B2 | 4/2008 | Murakawa | | |
| 7,707,495 B2 * | 4/2010 | Hosotsubo | | 715/243 |
| 8,046,730 B1 | 10/2011 | Ferguson et al. | | |
| 8,136,076 B2 * | 3/2012 | Bachina et al. | | 716/126 |
| 2009/0319975 A1 * | 12/2009 | Huynh et al. | | 716/10 |
| 2010/0100862 A1 * | 4/2010 | Ohtsuka | | 716/13 |
| 2013/0125078 A1 * | 5/2013 | Bosshart | | 716/126 |

OTHER PUBLICATIONS

NioPluse User Manual Version 2.0.1 (Draft), Apr. 26, 2012, NioPulse, 273 pages.
Microwave Office Training, Feb. 15, 2008, Advancing the Wireless Revolution, 15 pages.

\* cited by examiner

*Primary Examiner* — Phallaka Kik

(57) ABSTRACT

A method for operating a computer system to generate a layout of a device and a computer-readable medium containing instructions that cause a computer system to carry out that method are disclosed. The computer system has a display that includes a display area. The computer system provides a list of objects and creates user selected objects from the list for inclusion in the display area. The computer assigns one of a plurality of operating modes for each connectivity object in the layout. The computer generates a Net assignment for each connectivity object that is not forced to have a specific Net assignment and for which automatic assignment of a Net is allowed. The computer generated assignment depends on the operating mode associated with that connectivity object. The operating mode of at least one of the connectivity objects can be altered by input from a user of said computer system.

20 Claims, 12 Drawing Sheets

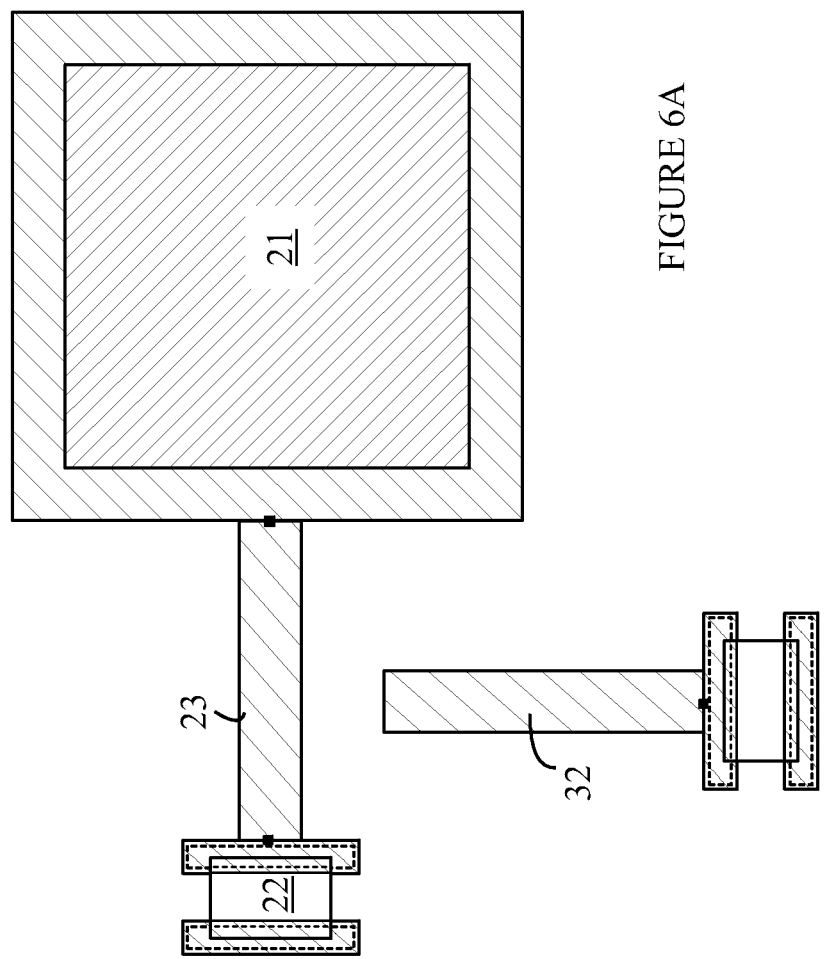

USER-CONTROLLABLE CONNECTIVITY ENGINE FOR ELECTRONIC DESIGN AUTOMATION TOOLS

BACKGROUND

Electronic design automation (EDA) tools are used to facilitate the design and testing of complex electronic circuitry. These systems provide tools for inputting both the schematic drawing for a circuit and the layout of the actual physical components on a semiconductor substrate or printed circuit board. For example, a transmission line in the schematic is represented in the layout by two physical conductors having defined widths and lengths that overlap one another on two different layers in the layout. The designer can alter the physical dimensions and placement of the components in the layout view during the layout process. In addition, the sizes and other parameters of the layout components can be optimized by the EDA tools during testing and optimization of the circuit parameters.

The schematic view and circuit layout view are typically linked such that the components of the circuit in the layout view remain connected during the editing of the layout view in the layout tools. As the user moves objects in the layout view, connectivity can be broken. Connectivity can also be broken when the user moves components connected by a trace in the layout view such that the conductor now includes a break. The layout software attempts to maintain connectivity in the layout view by providing constructs or actual wires that are introduced to complete the connection that was broken. In one system, the layout engine adds a physical wire to the layout that reconnects the two separated components. These wires can give rise to production errors if the wires are not manually removed at the end of the layout process. In another system, "Flight Wires" are introduced for this purpose. The Flight Wires are automatically removed when the connection is restored.

Similarly, when two objects in the layout are moved such that they overlap, an overlap region is formed that is indicated by specific pattern on the display that is automatically inserted by the layout engine. These overlaps signal that the objects need to be joined to form a single conductor. Again, the generation of these constructs is not under the control of the user.

In schematic driven modes of design, the software attempts to maintain synchronization between the layout and the schematic. In complex layouts, the number of these constructs and their locations can inhibit the designer's ability to efficiently input the design. In addition, the models used for maintaining connectivity during the layout process vary depending on the particular EDA product, and hence, users of one system can have difficulty when they are forced to work in a different system.

SUMMARY

The present invention includes a method for operating a computer system to generate a layout of a device and a computer-readable medium containing instructions that cause a computer system to carry out that method. The computer system has a display that includes a display area. A plurality of connectivity objects are defined for the device, each connectivity object being part of the device. An operating mode is defined for each connectivity object in the layout. The computer generates a Net assignment for each connectivity object that is not forced to have a specific Net assignment and for which automatic assignment of a Net is allowed. The computer generated assignment depends on the operating mode associated with that connectivity object. The operating mode of at least one of the connectivity objects can be altered by input from a user of said computer system.

In one aspect of the invention, defining the plurality of connectivity objects includes providing a list of objects in a user selectable format, including connectivity objects, that may be placed in said display area and included in said layout; and selecting a connectivity object from the list based on user input.

In one aspect of the invention, one of the modes prevents the computer from automatically assigning a Net for one of the connectivity objects. In another aspect of the invention, one of the operating modes causes the computer system to assign a Net to a first connectivity object that is not on already on a Net to a Net determined by a Net assignment to a second connectivity object that touches the first connectivity object. In a still further aspect of the present invention, one of the operating modes causes the computer system to assign a Net to a first connectivity object on a first Net that touches a second connectivity object on a second Net that is different from the first Net based on the second Net. In another aspect of the invention, one of the operating modes causes the computer system to re-assign a first connectivity object a new Net when the first connectivity object is separated from a second connectivity object and the first and second connectivity objects were assigned to the same Net. In another aspect of the invention, one of the operating modes causes the computer system to assign an orphaned connectivity object to a new unique Net when the connectivity object is created. In another aspect of the present invention, one of the operating modes causes the computer system to remove a Net assignment that is currently assigned to a connectivity object when it is orphaned.

In another aspect of the invention, the operating mode associated with one of said connectivity objects can be altered after the connectivity object has been created. In another aspect of the invention the operating mode associated with one of said connectivity objects is provided when the connectivity object is created.

BRIEF DESCRIPTION OF THE DRAWINGS

FIGS. 6A-6B illustrate the generation and removal of a Net Overlap Zone.

DETAILED DESCRIPTION

At the layout level, a circuit can be viewed as a plurality of objects that are connected together. In a layout design system according to the present invention, the user builds a layout by selecting objects from a menu and placing instances of those objects in the display area. The user can change the size and shapes of the objects and connect the objects to provide the layout of the final device.

Figures 1A, 1B, 1C:
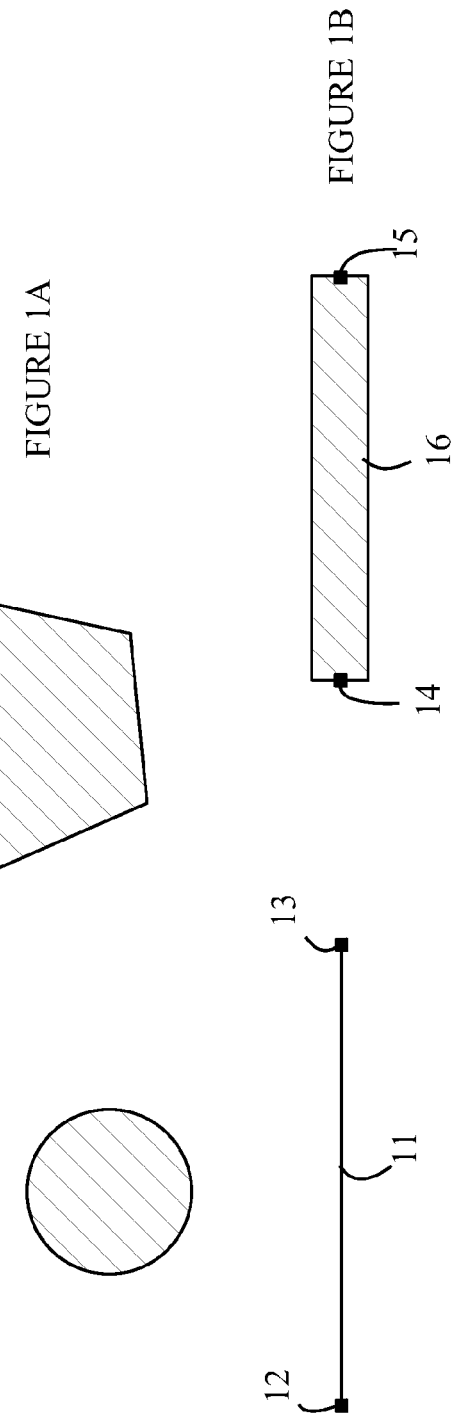
FIGS. 1A-C illustrate the classes of objects.

These objects can be viewed as belonging to five classes. Refer to FIGS. 1A-C, which illustrate the classes of objects. The first class consists of shapes such as rectangles, circles, polygons, etc. that are layers of conductor as shown in FIG. 1A.

Referring to FIG. 1B, the second class consists of wires and traces. Wire 11 has endpoints 12 and 13 that are connected by a line that has no thickness. Trace 16 differs from a wire in that trace 16 has a thickness as well as end points 14 and 15.

Referring to FIG. 1C, the third class consists of components such as resistors, capacitors, inductors, microstrip lines, transmission lines, etc. A component has two or more connection points and processes an input signal to produce an output signal. A resistor is shown at 19 in FIG. 1C with its connection points shown at 17 and 18.

The fourth class consists of Pins. Pins are connection points on objects such as the connection points on resistor 19 discussed above. A Pin can also be a separate object denoted by an arrow such as the arrow as discussed below. This type of Pin provides a connection point to circuitry that is external to the circuit in the layout.

The fifth class of objects are "helper objects" such as text labels, rulers, etc. Helper objects assist the designer while creating a layout, and are not part of the manufactured circuit or component. For example, a ruler will help the designer place two components at a specified spacing.

The manner in which the present invention provides its advantages can be more easily understood in terms of a logical construct referred to as a "Net". The first, second, and fourth classes of objects are referred to as connectivity objects in the following discussion, as these objects have functions analogous to wires in that they connect the other objects connected thereto to the same signal. A number of connectivity objects that are connected together to form a signal path are referred to as a "Net". A Net is analogous to a trace on a printed circuit board and represents an electrical path in a circuit. Any two points on a Net are shorted together electrically, and hence, have the same signal.

In the present invention, each connectivity object has a Net assignment, with the possible exception of orphaned shapes discussed below. The assignment can be made automatically by the present invention or forced by the user. When a change is made to the layout, new Net assignments are made to reflect the change. For example, if a connectivity object is introduced into the layout that fills a gap between two objects that are on different Nets, the Net assignments of the connectivity objects on one of the previously defined Nets must be changed to reflect the new connectivity of the layout.

A connectivity object that is not touching any other connectivity object is referred to as an orphaned connectivity object in the following discussion. A connectivity object can start out in an orphaned state because it is placed on the layout at a position such that it is not in contact with any other connectivity object. A connectivity object can become orphaned when it is moved from a position in which it was touching another connectivity object to a position in which it no longer touches other connectivity objects. Orphan shapes do not have Net assignments when they are initially created.

Figure 10:
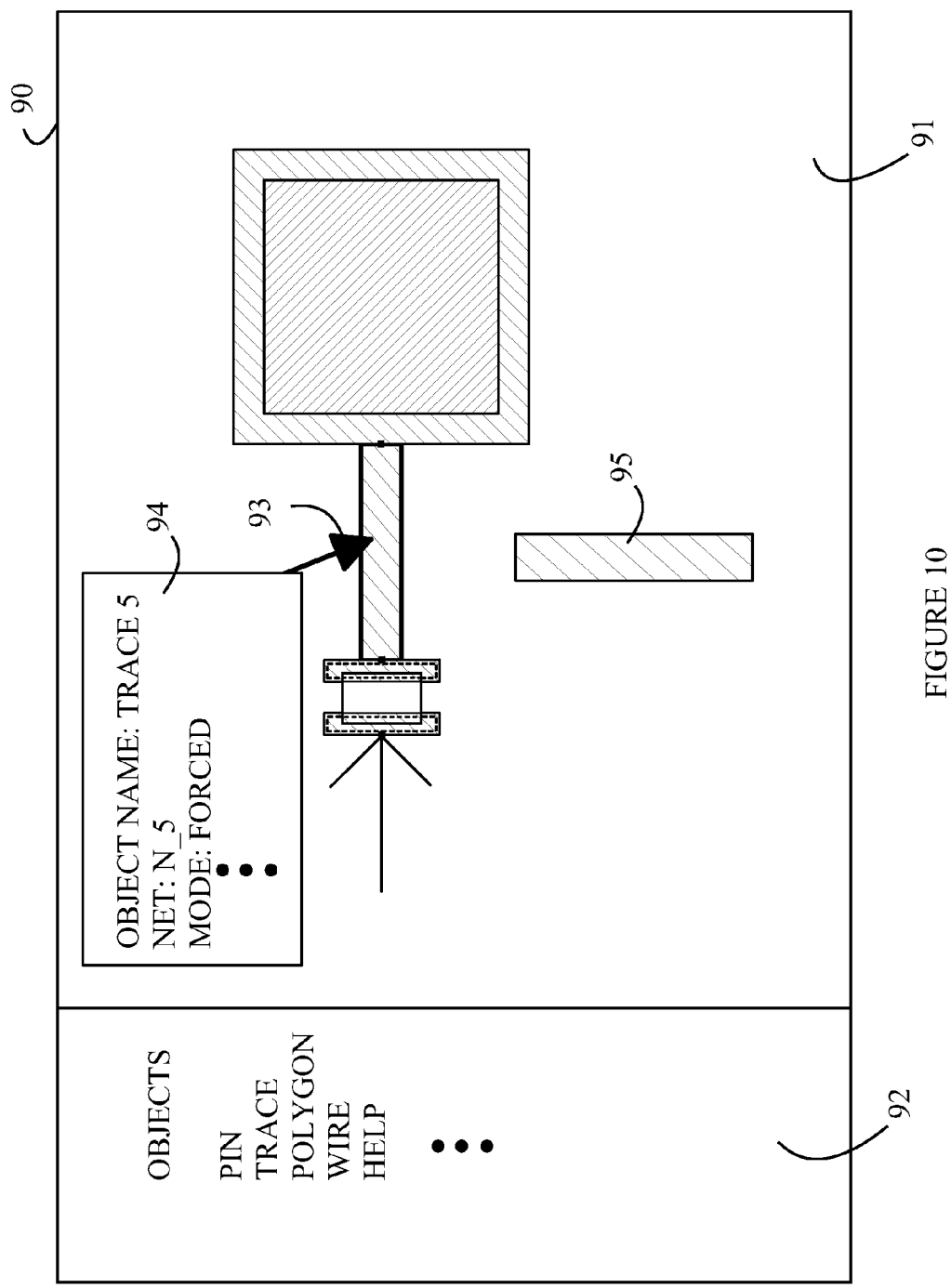
FIG. 10 illustrates the display that is used to input data that defines the layout of a device.

Refer now to FIG. 10, which illustrates the display that is used to input data that defines the layout of a device. Display 90 includes two windows 91 and 92. Window 91 displays the current layout with the objects that have been defined so far in the process. Window 92 displays a menu of possible objects that can be added to the display. In practice, the user indicates an item from window 92 and drags that item onto the display window 91. The user can modify the object by changing the object shape, location, or other parameters particular to the object in question. Shape 95 is an example of an orphaned connectivity object.

The user can specify a particular object using a cursor 93 and predetermined operation such as double clicking a mouse button associated with the cursor. A window 94 that provides the parameters associated with the object is then displayed. In one aspect of the invention, the user can edit the data shown in window 94, and hence, change the parameters associated with the corresponding object.

It should be noted that the display format shown in FIG. 10 is one exemplary display format. Other formats will be apparent from the following discussion. For example, the details of the menu that specify the available objects can be varied to make more efficient use of display space.

Figure 2A:
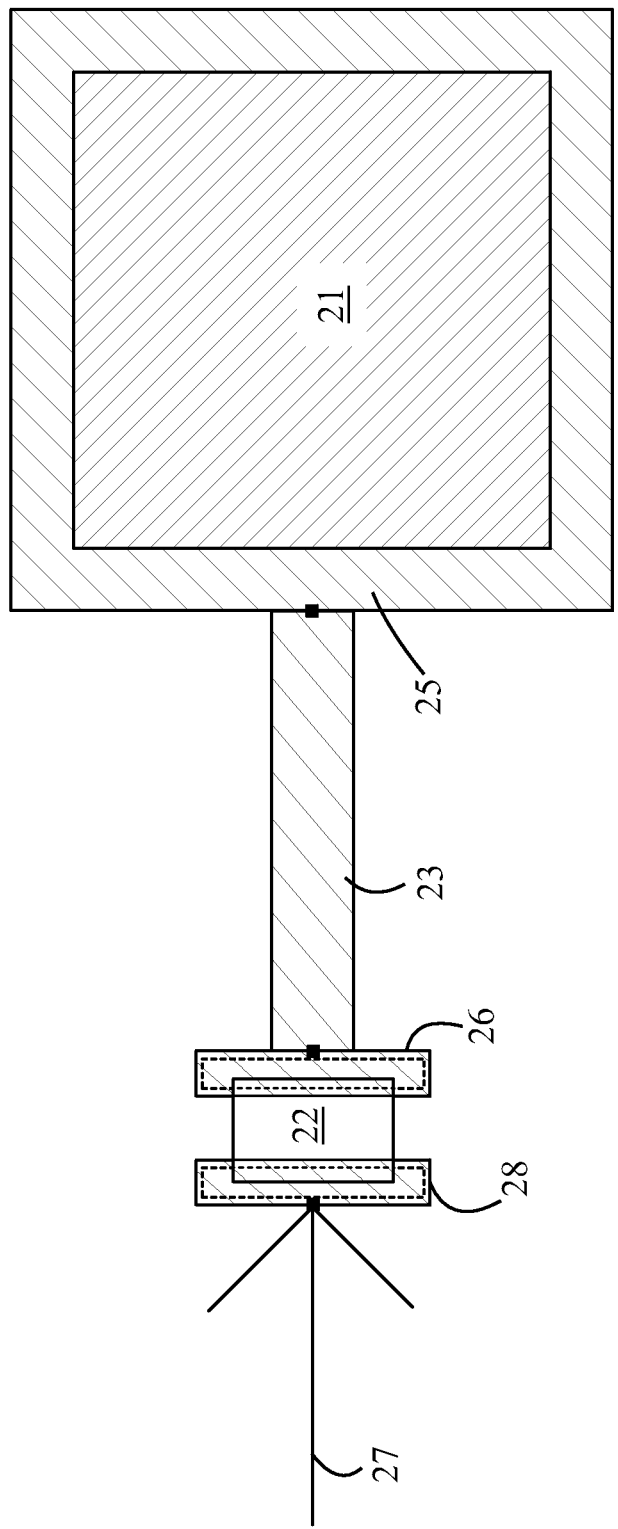
FIG. 2A illustrates a portion of a layout having a resistor and a capacitor.

Components are connected through various connectivity objects. Since a component transforms inputs thereto into outputs that are different from the inputs, the terminals on a component have different signals, and hence, are on different Nets. Refer to FIG. 2A, which illustrates a portion of a layout having a resistor and a capacitor. Capacitor 21 is connected to resistor 22 by trace 23 which is connected to a Pin 25 on capacitor 21 and a Pin 26 on resistor 22. The other Pin on resistor 22, Pin 28, is connected to a Pin 27 shown as an arrow. Pin 27 connects the resistor to an external signal or power source.

Figure 2B:
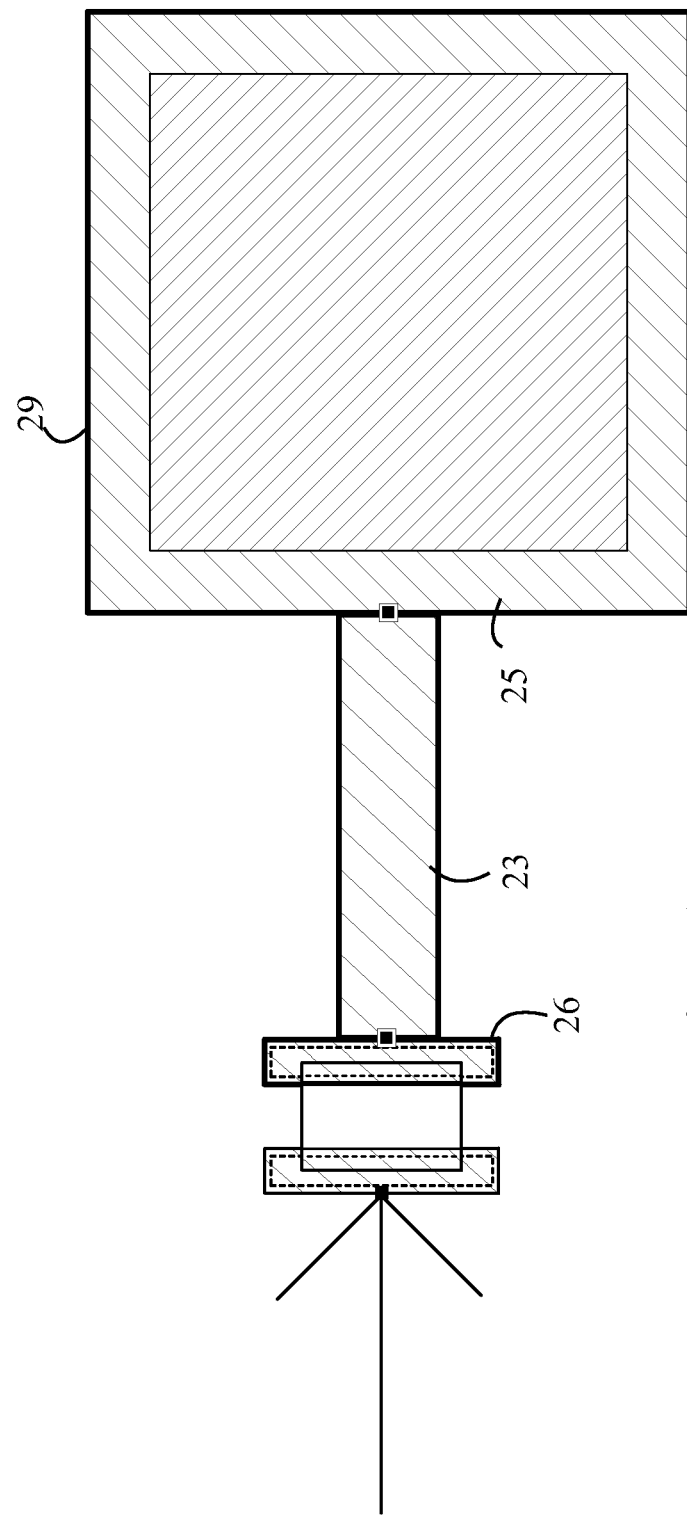
FIG. 2B illustrates the Nets included in the portion of the layout shown in FIG. 2A.

Refer now to FIG. 2B, which illustrates the Nets included in the portion of the layout shown in FIG. 2A. Pin 25, trace 23, and Pin 26 are on a first Net 29. The objects that are on this Net are indicated by the thicker boundary line in FIG. 2B. Pin 27 and Pin 28 are on a second Net that is different from the first Net.

Two connectivity objects that overlap one another are said to be touching. The objects can be on the same layer or different layers that bind. Two layers are said to bind if the layers can be interconnected electrically. For example, two metal layers in a semiconductor can be connected by a via that runs vertically between the metal layers.

A "Branch" is defined to be a group of connectivity objects that are touching, but may be on different Nets. A "Net Branch" is defined to be a group of connectivity objects which are touching and are on the same Net. Referring to FIG. 2B, Net 29 is a Net Branch. An example of a Branch in which the connectivity objects that are touching are on different Nets will be discussed below.

Figure 3:
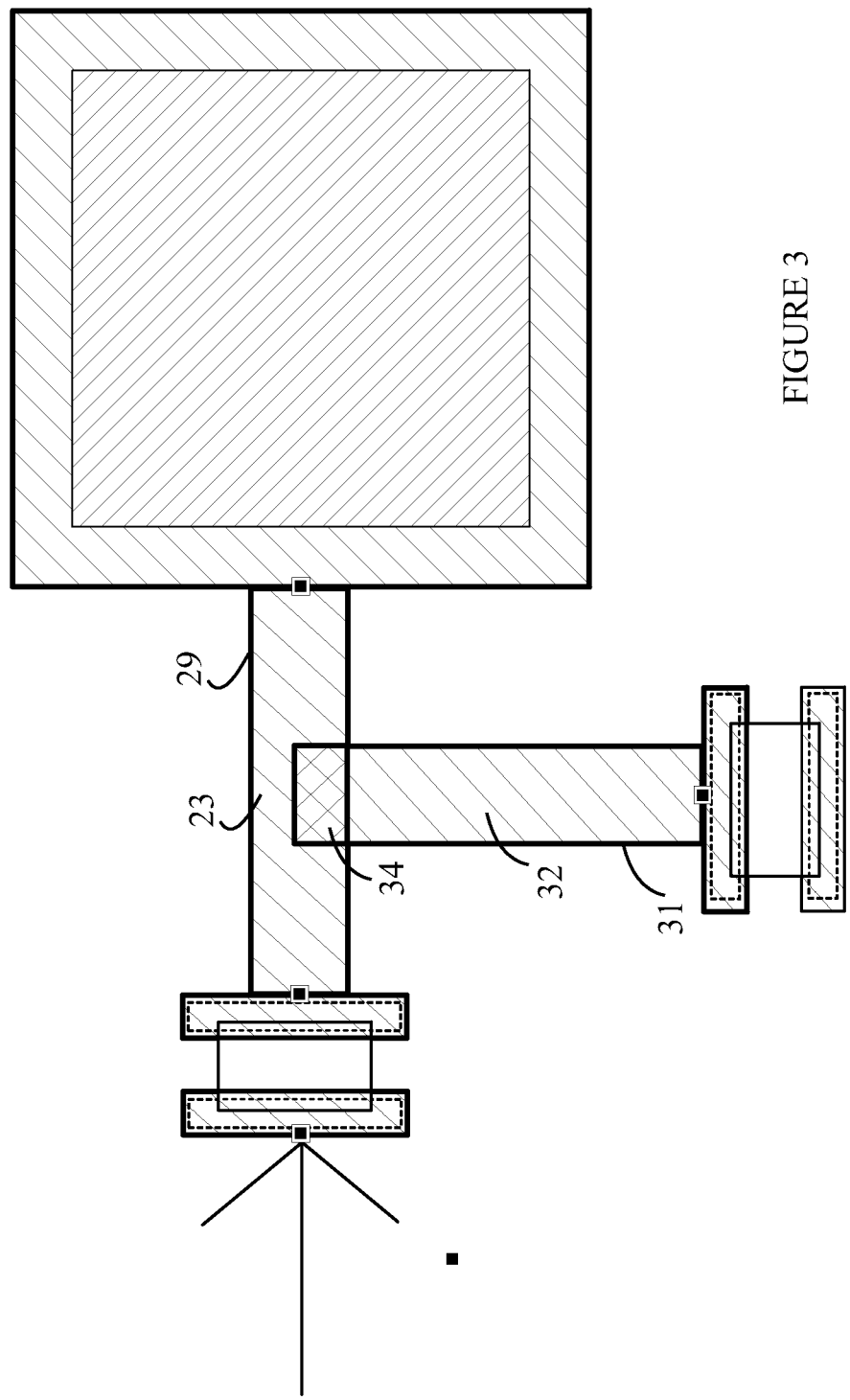
FIG. 3 illustrates a Net Overlap Zone.

Refer now to FIG. 3, which illustrates a Net Overlap Zone. Here, Net 31, which includes trace 32 overlaps trace 23 which is part of Net 29. In one aspect of the present invention, the Net Overlap Zone is shown in the layout view if the connectivity objects that are touching are not on the same Net. In this example, the Net Overlap Zone is shown at 34. The combination of traces 23 and 32 is an example of a Branch in which all the connectivity objects are not on the same Net.

Figure 4:
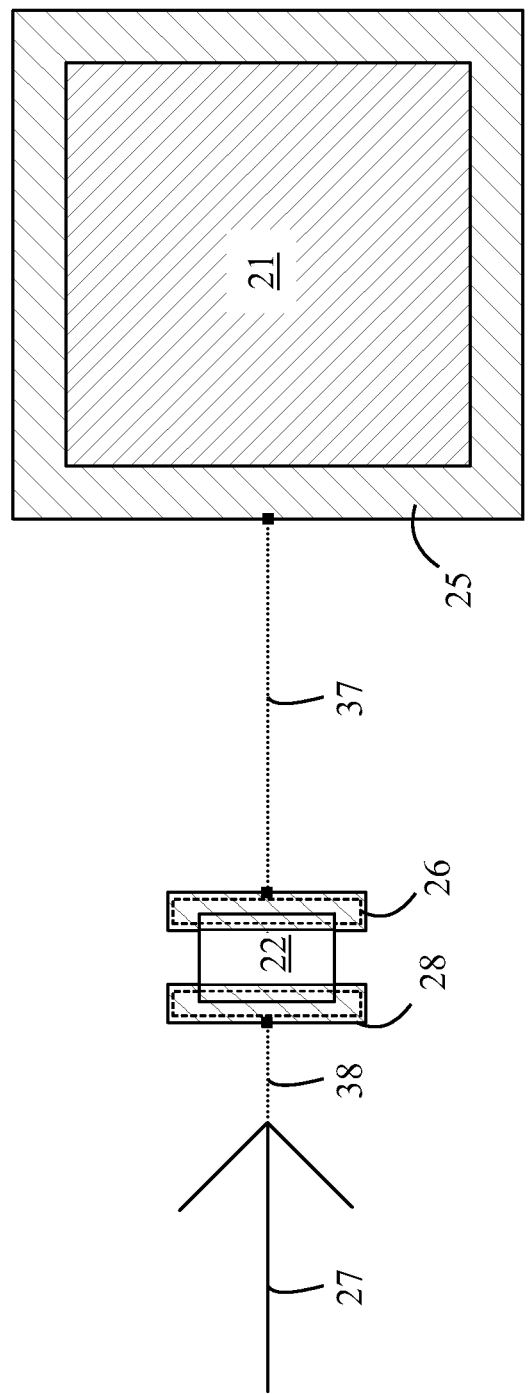
FIG. 4 shows a portion of FIG. 2A in which the user has deleted trace 23 and moved Pin 27 such that it no longer is connected to Pin 28.

In the present invention, Flight Wires show incomplete or "unrouted" Nets. A Flight Wire is defined to be a line that appears in display area 91 and indicates a missing connection between two connectivity objects. A Net that has multiple Net Branches because all of its connectivity objects are not touching is referred to as an unrouted Net. These connectivity objects are on the same Net, but not physically connected. The lack of connection can result from a connectivity object being removed. The Flight Wires show the missing connections by bridging the region that is not connected. Refer to FIG. 4. FIG. 4 shows a portion of FIG. 2A in which the user has deleted trace 23 and moved Pin 27 such that it no longer is connected to Pin 28. As a result, the remaining connectivity objects of the Net, i.e., Pin 25 and Pin 26, are no longer touching, and hence, Net 29 is now an unrouted Net. A Flight Wire 37 is calculated and added to the layout view to indicate a missing link. Similarly, a Flight Wire 38 is added to show the missing connection between Pin 27 and Pin 28.

In the present invention, the user has two options for removing a Flight Wire. First, the user can delete the Flight Wire by selecting the Flight Wire and pressing the delete key. The present invention then moves the connectivity objects that were connected by the Flight Wire to different Nets, and hence, the unrouted Net condition is removed and the Flight Wire is no longer generated to signal an unrouted Net. The operation of moving one of the Branches that was connected by the Flight Wire to a new Net is referred to as splitting the Net in the present invention. When the user splits the Net, the present invention assigns one of the two Branches to a new Net. The identifier for this Net is either provided automatically by the program or the user can provide an identifier for the new Net.

Figure 5:
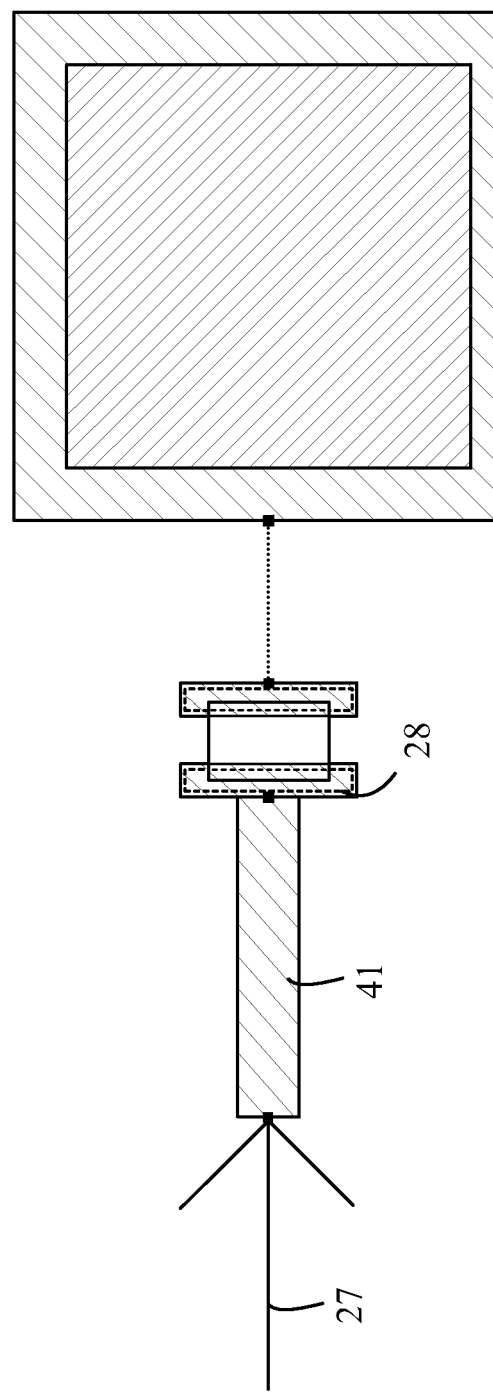
FIG. 5 illustrates the removal of a Flight Wire by filling a gap in the Net.

Second, the user can remove the Flight Wire by physically connecting the Net Branches with one or more connectivity objects such as traces or by moving one of the connectivity objects so that the gap is filled. Refer now to FIG. 5, which illustrates the removal of a Flight Wire by filling a gap in the Net. In this example, Pin 27 is reconnected to Pin 28 by inserting a trace 41 to fill the gap created by moving Pin 27. When the gap is eliminated by filling the gap, the underlying Net retains its identity, and the Flight Wires finally disappear when the last connectivity object is inserted such that the connectivity object touches both objects on the sides of the remaining gap.

Figure 6B:
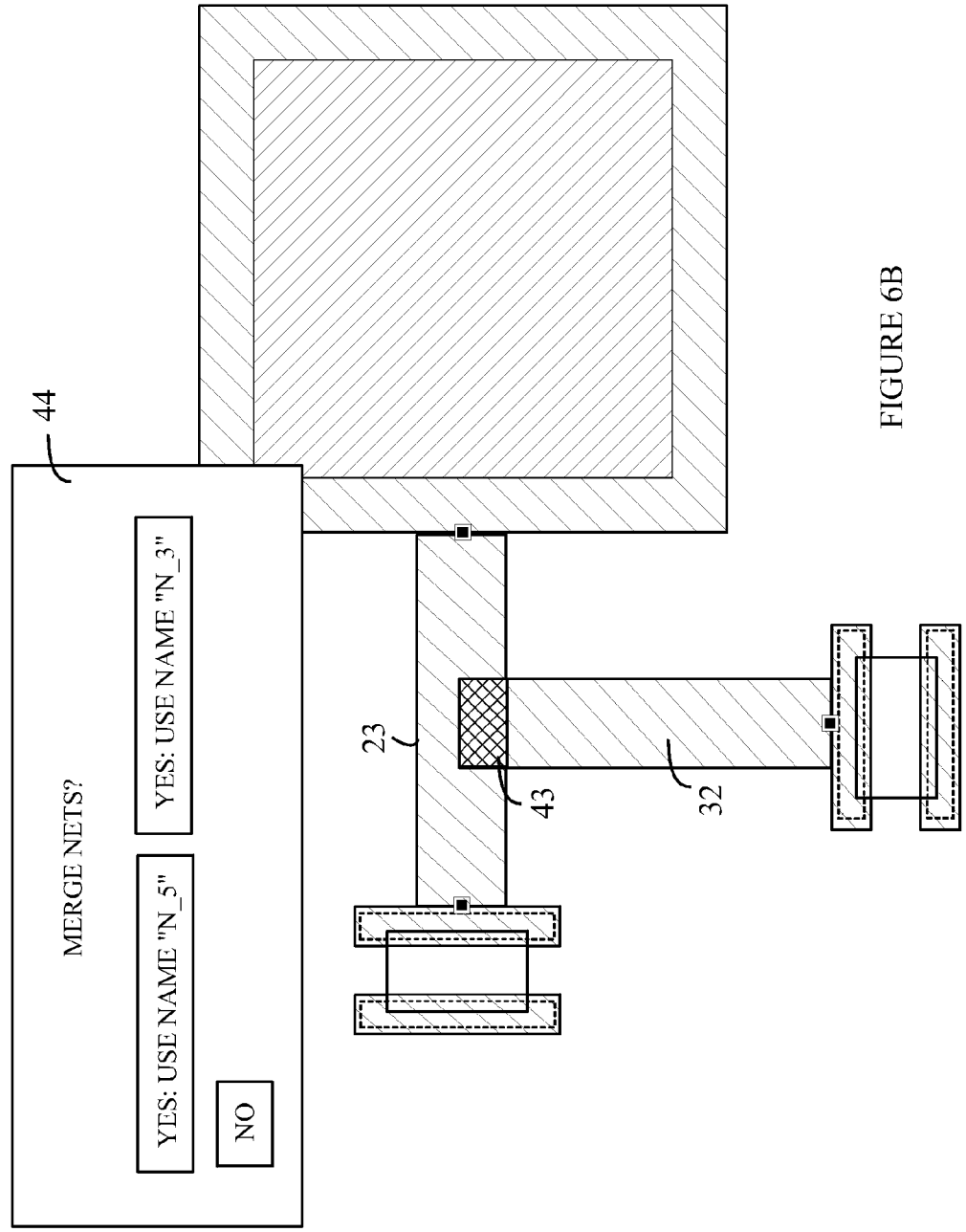

The present invention also gives the user control of Net Overlap Zones. Refer now to FIGS. 6A-6B, which illustrate the generation and removal of a Net Overlap Zone. FIG. 6A shows a portion of a layout having two Nets that are separate from one another. These are the two Nets shown in FIG. 3, prior to the Net Overlap Zone being created by moving one Branch to a position that overlaps the other Branch. FIG. 6B shows these Nets after the user has moved one of the Nets such that the two Nets now overlap. In this case, a Net Overlap Zone 43 is automatically generated. If the user selects Net Overlap Zone 43, a dialog box 44 appears, which asks if the user would like to merge the two Nets into a single Net. In this example, trace 32 is on Net N_3, and trace 23 is on Net N_5. The user is given the choice of a name for the merged Net from the names of the existing Nets. If the user chooses to merge the Nets, the unused Net name is eliminated, and the selected Net definition is enlarged to include the connection objects on the Net that was merged into the remaining Net. The Net Overlap Zone is then removed from the layout.

In one aspect of the invention, the behavior of the layout mode when two connectivity objects are brought together or disconnected can be configured as an automatic mode or a manual mode. In the automatic mode, three operations are carried out without user intervention when two connectivity objects start or stop touching. In the "Join" operating mode when a connectivity object not on a Net touches another connectivity object on a Net, the system of the present invention automatically puts the connectivity object that was not on a Net on the existing Net. If both of the connectivity objects are on separate Nets, touching them creates a Net Overlap Zone.

In the "Merge" operating mode, when a connectivity object on a first Net touches another connectivity object on a separate second Net, the first Net is automatically merged with the second Net by assignment of the connectivity objects on the first Net to the second Net. If one of the connectivity objects is not on a Net, that connectivity object is automatically placed on the same Net as the other connectivity object(s). Therefore, "Join" can be viewed as a sub-set of "Merge". When two connectivity objects that have been merged are touching, dragging them apart creates a Flight Wire.

In the "WYSIWYG" operating mode, when two connectivity objects, which are touching, are dragged apart, they "Split". In this case, each of the split objects is placed on a unique Net. WYSIWYG can be viewed as a super-set with both "Merge" and "Split", and neither creates a Flight Wire nor a Net Overlap Zone.

In the "manual" operating mode, automatic changes to the connectivity objects when the touching objects are dragged apart or when an object starts touching another are not performed. Dragging apart two connectivity objects on the same Net creates a Flight Wire. Touching two connectivity objects on separate Nets creates a Net Overlap Zone. The user then operates on the Flight Wire or Net Overlap Zones manually as discussed above.

Figure 9:
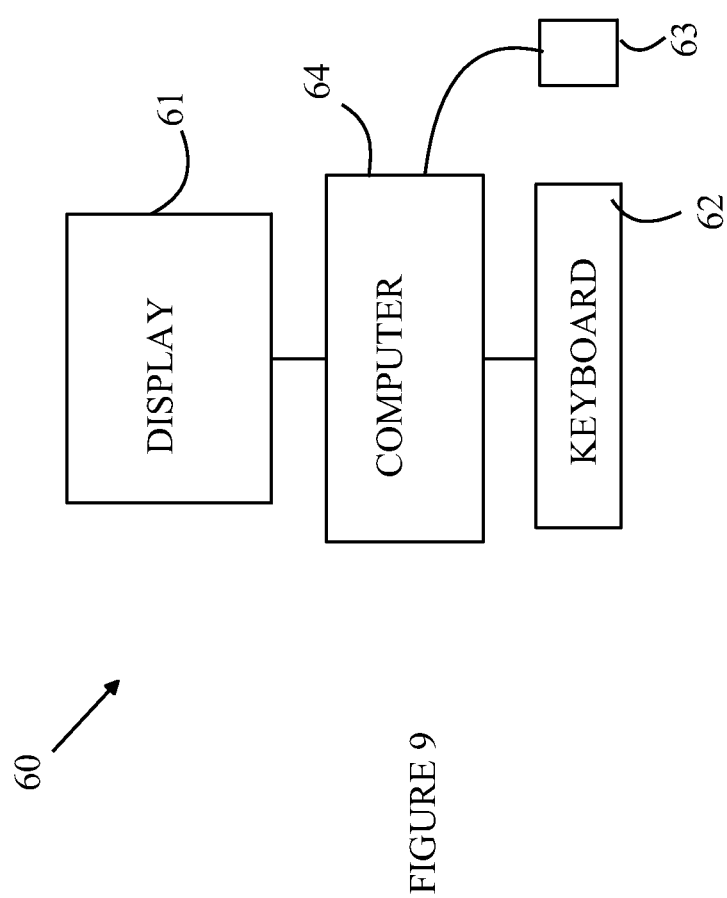
FIG. 9 illustrates a computer system that is suitable for practicing the present invention.

Refer now to FIG. 9, which illustrates a computer system that is suitable for practicing the present invention. The present invention can be practiced on a data processing system 60 that includes computer 64, a graphical user interface 61 for displaying the layout drawing, and a data input interface for receiving input from a user. The user typically inputs commands to the data processing system via a keyboard 62 and a pointing device 63. The data processing system maintains a database that includes a table specifying each connectivity object in the layout and a Net identifier for that object.

When the user creates a connectivity object, the connectivity object will be represented in a database in which space is allocated for a Net identifier for that object. In one aspect of the invention, three isolation modes are provided. In the "Create" operating mode, the data processing system automatically assigns a unique Net identification to an orphaned connectivity object when that connectivity object is created by the user. In the "Eliminate" operating mode, the orphaned connectivity object is removed from the current Net during the connectivity processing algorithm discussed below. In the "None" mode, an orphaned connectivity object neither creates nor eliminates a Net assignment associated with that connectivity object. The user can also force a connectivity object to be on a Net defined by the user.

The database also allocates space in the entry for each object to store a "mode" for that object. The mode identifies one of the modes discussed above. The connectivity algorithm uses these modes to alter how the connectivity objects are assigned to the Net after a change in the layout has occurred. The database also allocates space for a Branch identifier for each connectivity object.

Figure 7:
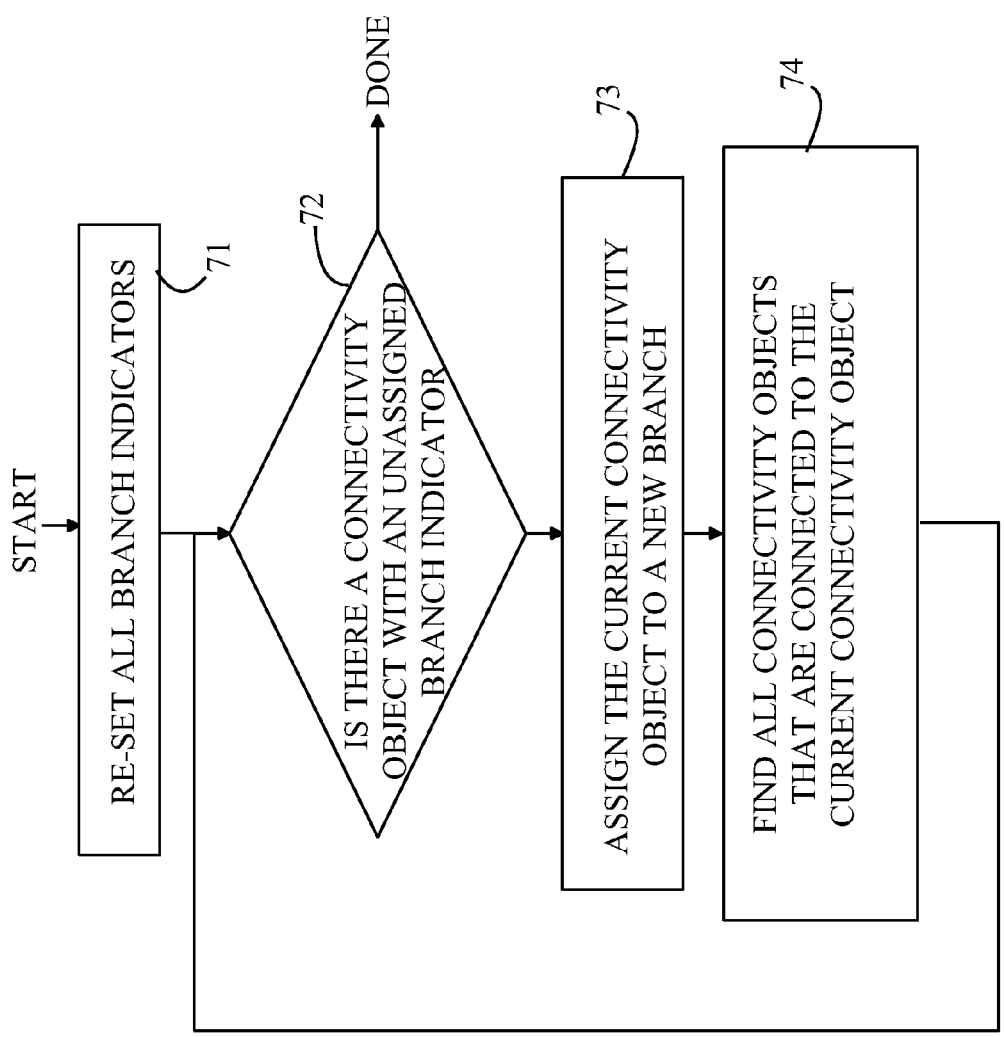
FIG. 7 is a flow chart of the procedure for identifying the Branches in the layout.

In one aspect of the invention, each time the layout changes, the data processing system recalculates the Nets, Flight Wires, and Net Overlap Zones that are to be displayed. Refer now to FIG. 7, which is a flow chart of the procedure for identifying the Branches in the layout. At the beginning of the process, all of the Branch indications are reset as shown at 71. Next, a determination is made as to whether there is a connectivity objected with an unassigned Branch indicator as shown at 72. If no connectivity object with an unassigned Branch indicator is found, the process is complete. If a connectivity object with an unassigned Branch indicator is found, that connectivity object is assigned a Branch indicator that has not yet been used for any connectivity object as shown at 73. Next all connectivity objects that touch that connectivity object either directly or through a connectivity object that has been assigned the Branch indicator are visited and given the same Branch identifier as shown at 74. The connectivity objects in the database are then searched for a connectivity object without a Branch indicator. When no connectivity object with an unassigned Branch field is left, all of the Branches are defined.

Figure 8:
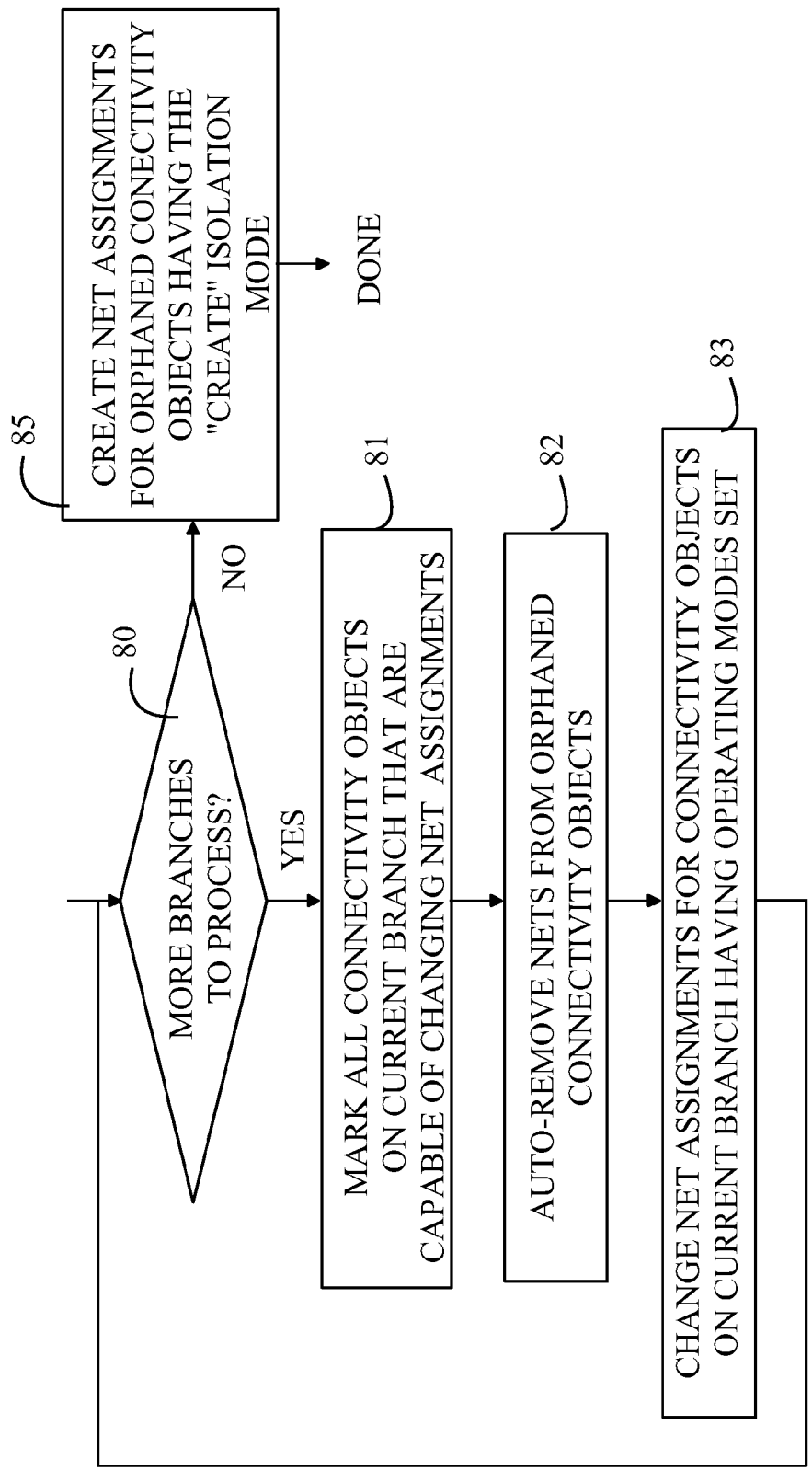
FIG. 8 illustrates the processing of each Branch.

The algorithm then proceeds to process each Branch. Refer now to FIG. 8, which illustrates the processing of each Branch. In the first step, all connectivity objects on the current Branch that have Net assignments that can be changed are marked as shown at 81. First, all connectivity objects on the Branch are marked as being "unvisited". Next, the connectivity objects on the Branch that are capable of changing their Net assignments are marked. This will be all connectivity objects on the Branch except connectivity objects which are already on a Net forced by the user or on an implicitly forced Net by virtue of being on the "Join" operating mode.

Next, the Net assignments from orphaned connectivity objects that can be removed from a Net are removed as shown at 82. A connectivity object is not removed from a Net if either the Branch has a forced Net, or any of the connectivity objects on the Branch is not marked with the "Eliminate" isolation mode discussed above. If a connectivity object is removed from a Net, the Net is deleted if the Net is empty and the Branch processing is finished for this step.

Next, the Branch connectivity is updated for connectivity objects having their operating mode set as shown at 83. This is a four pass procedure. In the first pass, connectivity objects that are touching but cannot change their Nets are identified as shown at 83. The connectivity objects are processed one at a time to reset the unvisited marking for connectivity objects that are either on a forced Net or an implicitly forced Net. When a such a connectivity object is found, the connectivity object is marked as visited. Then all connectivity objects on the same Net that touch the connectivity object in question either directly or through another connectivity object on the Net are marked as being incapable of having their Net assignment changed. Finally, all connectivity objects on the Branch are again reset to the "unvisited" state.

In the second pass, Net assignments to connectivity objects which are touching directly, or indirectly, and which can change their Net assignments are assigned new Net assignments if they are connected to a connectivity object that cannot have its Net assignment changed. This is accomplished by finding each connectivity object that is marked unvisited and which is either on a forced, or an implicitly forced, Net. For each such identified connectivity object, the connectivity object is marked as being visited. For each connectivity object that touches the identified connectivity object either directly or through another connectivity object, and which can change its Net assignment, put that connectivity object on the same Net as the identified connectivity object and mark that connectivity object as being incapable of changing its Net assignment.

In the third pass, Net assignments for connectivity objects that have the "Merge" operating mode set and have not been "visited" in the preceding passes are made. For each unvisited connectivity object with the "Merge" operating mode which is either on a forced, or an implicitly forced Net, mark the connectivity object as visited. Visit all connectivity objects that are touching this connectivity object either directly or indirectly through another connectivity object and that can change their Net assignments. Put these connectivity objects on the same Net as the identified connectivity object, and mark these connectivity objects as being incapable of changing their Nets.

In the fourth pass, Net assignments for connectivity objects that have the "WYSIWYG" operating mode set and have not been visited in the preceding passes are made. For each unvisited connectivity object with the WYSIWYG operating mode which is either on a forced, or an implicitly forced Net, mark the connectivity object as visited. Visit all connectivity objects that are touching this connectivity object either directly or indirectly through another connectivity object and that can change their Net assignments. Put these connectivity objects on the same Net as the identified connectivity object, and mark these connectivity objects as being incapable of changing their Nets. In one aspect of the invention, the identifiers for Nets that lost connectivity objects in this procedure are recorded. If one or more Nets are eliminated in this process, the eliminated Net names are placed in a recycle pool so that the same net names can be reused when required.

When all of the Branches have been processed as shown at 80, Nets are created for orphaned connectivity objects having the "Create" isolation mode set as shown at 85. The computer goes through the list of connectivity objects to find any remaining connectivity objects with the "Create" isolation mode set and that are not on a Net. For each such connectivity object, a new Net is created. Then any connectivity objects that can still have their Nets changed and which are connected directly or indirectly to the connectivity object in question are assigned to the new Net.

The above-described embodiments of the present invention have been layout driven. That is, the user enters the layout without reference to a schematic that has already been entered into the design system and which defines the connectivity between the various components of the device being designed. A schematic diagram can then be created from the completed layout view of the device.

However, the present invention can be utilized in a schematic driven system. In this case, Flight Wires are generated when a Net defined on the schematic is broken either because it has not been fully inputted in the layout mode by connecting all the connectivity objects corresponding to that Net or because components in the layout mode have been moved or eliminated. In the schematic driven embodiments, one or more of the connectivity objects are forced onto Nets that are defined in the schematic.

The present invention includes any computer readable medium that causes a computer to execute instructions that carry out the above-described method for operating a computer system. For the purposes of this application, the term "computer-readable medium" is defined to be any medium that constitutes patentable subject matter under 35 U.S.C. 101. Examples of such media are non-transient media such as memory devices.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method of operating a computer system having a display area to provide a layout for an electronic device, said method comprising:
   defining a plurality of connectivity objects within said computer system, each connectivity object being part of said electronic device;

receiving one of a plurality of operating modes for each connectivity object in said layout, said operating mode determining how a Net is automatically assigned to that connectivity object, said operating mode of at least one of said connectivity objects being alterable by input from a user of said computer system; and for each connectivity object that is not forced to have a specific Net assignment and for which automatic assignment of a Net is allowed by said operating mode received for that connectivity object, causing said computer system to make a Net assignment for that connectivity object based on said operating modes and Nets assigned to other connectivity objects that are connected to that connectivity object.

2. The method of claim 1 wherein defining said plurality of connectivity objects comprises:

providing a list of objects in a user selectable format, including connectivity objects, that are placed in said display area and included in said layout; and selecting a connectivity object from said list of objects based on user input.

3. The method of claim 1 wherein one of said operating modes prevents said computer from automatically assigning a Net for that connectivity object.

4. The method of claim 1 wherein one of said operating modes causes said computer system to assign a Net to a first connectivity object that is not on already on a Net to a Net determined by a Net assignment to a second connectivity object that touches said first connectivity object.

5. The method of claim 4 wherein said computer displays a Net Overlap Zone if said first and second connectivity objects are assigned different Nets.

6. The method of claim 1 wherein one of said operating modes causes said computer system to assign a Net to a first connectivity object on a first Net that touches a second connectivity object on a second Net that is different from said first Net based on said second Net.

7. The method of claim 1 wherein one of said operating modes causes said computer system to re-assign a first connectivity object a new Net when said first connectivity object is separated from a second connectivity object and said first and second connectivity objects were assigned to the same Net.

8. The method of claim 1 wherein one of said operating modes causes said computer system to assign an orphaned connectivity object to a new unique Net when said connectivity object is created.

9. The method of claim 1 wherein one of said operating modes causes said computer system to remove a Net assignment that is currently assigned to one of said connectivity objects when that connectivity object is orphaned.

10. The method of claim 1 wherein said operating mode associated with one of said connectivity objects is altered after said connectivity object has been created.

11. The method of claim 1 wherein said operating mode associated with one of said connectivity objects is provided when said connectivity object is created.

12. A computer-readable medium that includes instructions that cause a computer having a display area to generate a layout of a device by:

defining a plurality of connectivity objects, each connectivity object being part of said device;

receiving one of a plurality of operating modes for each connectivity object in said layout, said operating mode determining how a Net is automatically assigned to that connectivity object, said operating mode of at least one of said connectivity objects being alterable by input from a user of said computer system; and for each connectivity object that is not forced to have a specific Net assignment and for which automatic assignment of a Net is allowed by said operating mode received for that connectivity object, assigning a Net assignment for that connectivity object based on said operating modes and Nets assigned to other connectivity objects that are connected to that connectivity object.

13. The computer-readable medium of claim 12 wherein defining said plurality of connectivity objects comprises:

providing a list of objects in a user selectable format, including connectivity objects, that are placed in said display area and included in said layout; and selecting a connectivity object from said list of objects based on user input.

14. The computer-readable medium of claim 12 wherein one of said operating modes prevents said computer from automatically assigning a Net for that connectivity object.

15. The computer-readable medium of claim 12 wherein one of said operating modes causes said computer system to assign a Net to a first connectivity object that is not already on a Net to a Net determined by a Net assignment to a second connectivity object that touches said first connectivity object.

16. The computer-readable medium of claim 15 wherein said computer displays a Net Overlap Zone if said first and second connectivity objects are assigned different Nets.

17. The computer-readable medium of claim 12 wherein one of said operating modes causes said computer system to assign a Net to a first connectivity object on a first Net that touches a second connectivity object on a second Net that is different from said first Net based on said second Net.

18. The computer-readable medium of claim 12 wherein one of said operating modes causes said computer system to re-assign a first connectivity object a new Net when said first connectivity object is separated from a second connectivity object and said first and second connectivity objects were assigned to the same Net.

19. The computer-readable medium of claim 12 wherein one of said operating modes causes said computer system to assign an orphaned connectivity object to a new unique Net when said connectivity object is created.

20. The computer-readable medium of claim 12 wherein one of said operating modes causes said computer system to remove a Net assignment that is currently assigned to one of said connectivity objects when that connectivity object is orphaned.

* * * * *

UNITED STATES PATENT AND TRADEMARK OFFICE
CERTIFICATE OF CORRECTION

PATENT NO.         : 8,584,077 B1
APPLICATION NO.    : 13/562173
DATED              : November 12, 2013
INVENTOR(S)        : Arbind Kumar et al.

It is certified that error appears in the above-identified patent and that said Letters Patent is hereby corrected as shown below:

On Title page, Item (56), under "Other Publications", in column 2, line 1, delete "NioPluse" and insert --NioPulse--, therefor.

Signed and Sealed this
Twenty-fifth Day of February, 2014

Michelle K. Lee
*Deputy Director of the United States Patent and Trademark Office*